(12) United States Patent
Atasoy et al.

(10) Patent No.: US 10,126,648 B2
(45) Date of Patent: Nov. 13, 2018

(54) COMPOSITION SUITABLE FOR USE AS A RELEASE-OPTIMIZED MATERIAL FOR NANOIMPRINT PROCESSES AND USES THEREOF

(71) Applicant: MICRO RESIST TECHNOLOGY GESELLSCHAFT FÜR CHEMISCHE MATERIALIEN SPEZIELLER PHOTORESISTSYSTEME MBH, Berlin (DE)

(72) Inventors: Hakki Hakan Atasoy, Berlin (DE); Gabi Grützner, Berlin (DE); Marko Vogler, Berlin (DE)

(73) Assignee: MICRO RESIST TECHNOLOGY GESELLSCHAFT FÜR CHEMISCHE MATERIALIEN SPEZIELLER PROTORESISTSYSTEME GMBH, Berlin (DE)

( * ) Notice: Subject to any disclaimer, the term of this patent is extended or adjusted under 35 U.S.C. 154(b) by 627 days.

(21) Appl. No.: 14/401,466

(22) PCT Filed: May 24, 2013

(86) PCT No.: PCT/EP2013/001537
§ 371 (c)(1),
(2) Date: Nov. 14, 2014

(87) PCT Pub. No.: WO2013/174522
PCT Pub. Date: Nov. 28, 2013

(65) Prior Publication Data
US 2015/0079351 A1    Mar. 19, 2015

Related U.S. Application Data

(60) Provisional application No. 61/651,745, filed on May 25, 2012.

(51) Int. Cl.
G03F 7/004 (2006.01)
G03F 7/00 (2006.01)
G03F 7/028 (2006.01)
B82Y 10/00 (2011.01)
B82Y 40/00 (2011.01)

(52) U.S. Cl.
CPC ............ G03F 7/0046 (2013.01); B82Y 10/00 (2013.01); B82Y 40/00 (2013.01); G03F 7/0002 (2013.01); G03F 7/028 (2013.01); Y10T 428/24479 (2015.01); Y10T 428/24612 (2015.01)

(58) Field of Classification Search
CPC ....................................... G03F 7/0002
See application file for complete search history.

(56) References Cited

U.S. PATENT DOCUMENTS

| 2008/0000373 A1 | 1/2008 | Petrucci-Samija et al. |
| 2008/0055581 A1* | 3/2008 | Rogers .................. B82Y 10/00 355/95 |

(Continued)

*Primary Examiner* — Ian A Rummel
(74) *Attorney, Agent, or Firm* — Duane Morris LLP; Gregory M. Lefkowitz; Jason M. Nolan

(57) ABSTRACT

The present invention relates to a composition suitable for use as a release-optimized material for nanoimprint processes, process of production and uses thereof.

8 Claims, 3 Drawing Sheets

(56) References Cited

U.S. PATENT DOCUMENTS

| | | | |
|---|---|---|---|
| 2008/0105649 A1* | 5/2008 | Chandrachood | B82Y 10/00 |
| | | | 216/47 |
| 2008/0145525 A1 | 6/2008 | Guo et al. | |
| 2008/0315459 A1* | 12/2008 | Zhang | B29C 33/424 |
| | | | 264/338 |
| 2009/0028910 A1 | 1/2009 | DeSimone et al. | |
| 2010/0160478 A1* | 6/2010 | Nilsson | B82Y 10/00 |
| | | | 522/170 |
| 2010/0308008 A1 | 12/2010 | Zhu et al. | |
| 2011/0298158 A1 | 12/2011 | Koo et al. | |
| 2012/0064457 A1 | 3/2012 | Hinch et al. | |
| 2012/0189728 A1 | 7/2012 | Rolland et al. | |

\* cited by examiner

COMPOSITION SUITABLE FOR USE AS A RELEASE-OPTIMIZED MATERIAL FOR NANOIMPRINT PROCESSES AND USES THEREOF

CROSS-REFERENCE TO RELATED APPLICATIONS

This application is a § 371 national stage entry of International Application No, PCT/EP2013/001537, filed May 24, 2013, which priority to U.S. Provisional Patent Application No. 61/651,745, filed May 25, 2012, the entire contents of which are incorporated herein by reference.

TECHNICAL FIELD

The present invention relates to a composition suitable for use as a release-optimized material for nanoimprint processes, process of production and uses thereof.

PRIOR ART

Nanoimprint lithography (NIL) has already been proposed in 1996 as a high-throughput, low-cost non-traditional technology, which enables creating patterns with feature sizes down to 10 nanometers and below (S. Y. Chou et al., *J. Vac. Sci. Technol.* B14 (1996), 4129).

NIL is a hot embossing process, where a stamp (mold) is pressed into a thin polymer layer of a resist, which is heated above its glass transition temperature ($T_g$). Resist and stamp are cooled after a specific hold time to a temperature below $T_g$ of the resist polymer and the stamp is released. The remaining residual resist layer in the compressed areas is finally removed generally by anisotropic oxygen plasma etching to open the windows to the substrate. To increase thermal stability of the materials, the polymers are preferably chosen among thermoplastics with high $T_g$ or among crosslinkable materials either by way of thermal or by photochemical curing, e.g. UV-curing (F. Reuther, "Advanced Polymers and Resists—A Key to the Development of Nanoimprint Lithography", *J. Photopolym. Sci. Technol.,* 8 (2005) 525-30).

In December 2003, NIL was included in the International Technology Roadmap for Semiconductors (ITRS) as a next-generation lithography candidate to be employed at the 32-nm node recognizing the great potential of NIL for microelectronics. Moreover, there are a number of applications in areas outside of integrated circuit (IC) manufacturing, e.g. applications in integrated optics, nanophotonic devices, bit-patterned media, light emitting diodes (LED), but also (bio)sensors and lab-on-chip devices.

While NIL-based nanofabrication is currently in transition from R&D motivated background to a real industrial production environment, the general acceptance and applicability of NIL is closely linked to the availability of suitable material systems. Specific demands originate from the variety of possible applications as well as the fact, that NIL is a contact-based technology, where an exact replication of a stamp surface topography is generated via molding. This applies for standard thermal and UV-based NIL (T-NIL and UV-NIL) processes as well as advanced step-and-repeat (S&R) or roller-based (roll-to-plate or roll-to-roll) nanoimprint methods.

A variety of commercial resists have been introduced covering the diverse technical requirements from thermal and UV-based NIL as well as from wafer-scale, S&R and roller-based replication methods.

According to F. Reuther (ibid.) many investigations in NIL have in the beginning been carried out with poly(methyl methacrylate) (PMMA), which is also well known as an electron-beam resist. PMMA used as NIL resist is preferred with molecular weights of 35 k-75 k, because of the lower zero shear viscosity of the polymers, a PMMA glass transition temperature ($T_g$) of about 105° C., and applied imprint temperatures of 150-180° C. However, PMMA exhibits low plasma etch resistance due to its aliphatic character so that its etch resistance can be unsatisfactory, in case the imprinted patterns shall serve as an etch mask.

Alternative NIL resists are commercially available (mr-I 7000E and mr-I 8000E of micro resist technology GmbH), which are based on acrylate-based polymers and co-polymers containing aromatic components, which are proven to be more etch selective in comparison to aliphatic analogs.

Since there is an increasing demand to enhance the lifetime of stamps and to reduce de-molding defects (i.e. deformation or tear-off of high resolution and/or high aspect ratio structures), the optimal reduction of release forces is generally accomplished in the state of the art by enhancement of anti-adhesive properties of stamp coatings (anti-sticking layers, ASL). The application of the stamp coating is, however, a high cost factor in mass production, because life-time of the ASL is limited and difficult to standardize, the coating quality cannot be inspected easily across the whole stamp surface and the pattern fidelity in particular at sub-50 nm level can be affected, too.

Accordingly, modified methacrylate-based resist polymers (mr-I 7000R and mr-I 8000R of micro resist technology GmbH) are available, wherein the methacrylic polymers are blended with non-reactive polymeric or oligomeric fluorosurfactants to lower the release forces during de-molding and, thus, facilitate the imprinting process. Although the non-reactive fluorosurfactants may serve to improve the NIL imprinting, e.g. flow and mold release, they can lead to higher resolution when used in small amounts mentioned hereinbefore. However, the use of anti-sticking layers on the stamps may not be avoided with respect to all of the available stamp materials. In addition the non-reactive fluorosurfactants may also significantly deteriorate the adhesion behavior of the solid polymer layer when the mass content thereof is above 5 wt.-% based on the solid polymer mass. In case the mass content of the non-reactive fluorosurfactants is above 10 wt.-% based on the solid polymer mass, no continuous, stable, and homogeneous layers may be obtained for NIL imprinting.

It is the aim of the present invention to provide an improved composition suitable for use as a resist in nanoimprint lithography processes, preferably in high throughput NIL processes, which provides a reduced defect rate when de-molding the imprinted resist from the stamp and at the same time provides suitable substrate adhesion and/or etch selectivity and/or aspect ratio and/or resolution and/or wetting properties and/or allows suitable formation of a continuous, stable and homogenous layer.

BRIEF DESCRIPTION OF THE INVENTION

The aforementioned aim is solved by means of the claimed inventive subject matter. Preferred embodiments are described in the dependent claims as well as in the following description.

Accordingly a first aspect of the invention relates to a composition suitable for use as resist in nanoimprint lithography processes, characterized in that it comprises or consists of a perfluoropolyether (PFPE)-based reactive copolymer, a suitable reactive diluent and a suitable polymerization initiator.

A second aspect of the invention relates to a use of an inventive resist composition as a resist in nanoimprint lithography processes.

A third aspect of the invention relates to a use of an inventive resist composition as a stamp material (mold) for use in nanoimprint lithography.

A fourth aspect of the invention relates to a process of production of an inventive resist composition, characterized in that a perfluoropolyether (PFPE)-based reactive copolymer, a suitable reactive diluent and a suitable polymerization initiator are admixed.

A fifth aspect of the invention relates to a process of production of an imprinted resist article by use of nanoimprint processes comprising or consisting of the following steps:
 a. providing a substrate suitable for nanoimprint processes,
 b. applying a suitable amount of the inventive resist composition on at least part of the surface of the substrate provided in step a),
 c. providing a stamp suitable for nanoimprint processes and imprinting the inventive resist composition applied to the substrate in step b) with the stamp to generate a negative copy of the stamp topography on the resist and
 d. subsequently releasing the stamp to set free an imprinted resist article.

A sixth aspect of the invention relates to an inventive imprinted resist article obtainable by the inventive nanoimprint process.

A seventh aspect of the invention relates to a process of production of a nanopatterned and/or nanoprocessed substrate article by use of nanoimprint lithography processes comprising or consisting of the following steps:
 a. providing a substrate suitable for nanoimprint lithography processes,
 b. applying a suitable amount of the inventive resist composition on at least part of the surface of the substrate provided in step a).
 c. providing a stamp suitable for nanoimprint lithography processes and imprinting the inventive resist composition applied to the substrate in step b) with the stamp to generate a negative copy of the stamp topography on the resist,
 d. releasing the stamp to set free an imprinted resist article on the substrate and
 e. subsequently using at least a part of the imprinted resist article as an etch mask to produce a nanopatterned substrate article comprising at least part of a positive copy of the topography of the imprinted resist article and/or
 f. subsequently etching a part of the imprinted resist article and using the partly etched imprinted resist article as a deposition mask to deposit a further material to the substrate to produce a heterogeneous nanoprocessed substrate article.

An eighth aspect of the invention relates to an inventive nanopatterned and/or nanoprocessed substrate article obtainable by the inventive nanoimprint lithography process.

An ninth aspect of the invention relates to a use of the inventive imprinted resist article or the inventive nanopatterned and/or nanoprocessed substrate article in integrated circuits (IC); integrated optics; nanophotonic devices; photovoltaic devices, preferably solar cells; bit-patterned media; displays, preferably TFT-displays; diodes, preferably light emitting diodes (LED) or organic light emitting diodes (OLED); (bio)sensors and/or lab-on-chip devices.

The aforementioned inventive embodiments can—as far it is reasonable in view of a technical expert—comprise any possible combination of the preferred inventive embodiments, which are disclosed in the following and in particular in the dependent claims.

DETAILED DESCRIPTION OF THE INVENTION

Figure 1:
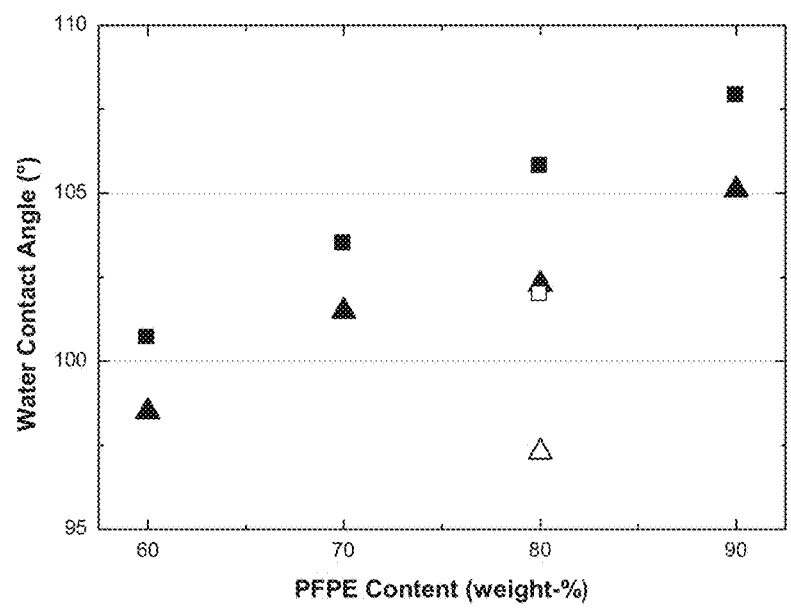
FIG. 1 shows a comparison of the water contact angles of cured inventive resist prototype surfaces in an analogue series with an increasing amount of PFPE content.

The inventors have surprisingly identified that the inventive resist composition comprising perfluoropolyether (PFPE), a suitable reactive diluent, and a suitable polymerization initiator can be used as resist in high throughput nanoimprint lithography processes, wherein the inventive resist composition provides advanced release properties with a reduced defect rate when de-molding the imprinted resist from a stamp and at the same time provides suitable substrate adhesion and/or etch selectivity and/or aspect ratio and/or resolution and/or wetting properties and/or allows suitable formation of a continuous, stable and homogenous layer.

The inventive resist composition generally exhibits due to the perfluoropolyether (PFPE) constituent low surface energies, in particular below 30 mJ/m$^2$, so that there are only minor interactions with commonly used stamp materials, preferably comprising or consisting of Silicon (Si), glass/quartz, Nickel (Ni), polydimethylsiloxane (PDMS) and its derivatives, ethylene tetrafluoroethylene (ETFE), polytetrafluoroethylene (PTFE), cyclic olefin copolymer (COC), polyurethane acrylate-based polymers (PUA, e.g. MINS-311RM, Minuta Technology Co., Ltd., Osan. Korea), and/or organic-inorganic hybrid materials (e.g., OrmoStamp®, micro resist technology GmbH, Berlin), or stack assemblies of the hereinbefore mentioned materials on rigid or flexible carrier materials, like plastic foils or glass backplates, preferably comprising one or more further coatings or layers for adhesion promotion or for enhanced physical or optical functionality, such as a stack comprising or consisting of tridecafluoro-(1,1,2,2)-tetrahydrooctyl-trichlorosilane (F13-TCS), an organic-inorganic hybrid polymer, preferably OrmoStamp® (micro resist technology GmbH, Berlin, Germany), adhesion promotor, preferably OrmoPrime®08 OrmoStamp® (micro resist technology GmbH, Berlin, Germany), an oxygen-barrier layer and a flexible polymer foil or a stack comprising or consisting of tridecafluoro-(1,1,2,2)-tetrahydrooctyl-trichlorosilane (F13-TCS), an organic-inorganic hybrid polymer, preferably OrmoStamp® (micro resist technology GmbH, Berlin, Germany), polydimethylsiloxane (PDMS) and a glass backplane. Thus, excellent release properties in NIL processes apply to the inventive resist composition.

As an example in case the stamp material does not comprise an anti-sticking layer the inventive resist composition can provide NIL imprinted resist articles with a defect-free resolution in the area of sub-100 nm and at the same time provides a suitable substrate adhesion. In case the stamp material comprises an anti-sticking layer the inventive resist composition can provide NIL imprinted resist articles with a defect-free resolution in the area of sub-20 nm.

According to the present invention the term "inventive resist composition suitable for use as resist in nanoimprint lithography processes" is interchangeably used with "inventive resist composition" or "inventive composition" and refers to a polymerizable composition comprising or consisting of a PFPE-based reactive copolymer, a suitable reactive diluent and a suitable polymerization initiator, which can be used as an etch mask for structure transfer in a nanoimprint lithography process (NIL), preferably under conditions for dry etching, like isotropic oxygen plasma etching, anisotropic reactive ion etching (RIE), inductively coupled plasma (ICP) process, or the Bosch process, as well as physical etching techniques like ion milling.

Although the inventive resist composition can furthermore comprise inert solvent in particular to facilitate fine adjustment of layer thickness of the inventive resist composition or tuning of the viscosity in particular for ink-jet dispensing techniques, the inert solvent needs to be removed from the inventive resist composition prior to the imprinting and curing steps of the NIL processes.

Accordingly, as the inert solvent is removed from the inventive resist composition prior to polymerization thereof, the terms "total weight of the inventive resist composition" and "total weight of the inventive composition", which terms are interchangeably used, relate to the total weight of the inventive resist composition, which will be polymerized in the NIL process, in particular which essentially does not comprise inert solvent. In other words in case an inventive resist composition comprises inert solvent, the weight thereof is in connection with the present invention not accounted for the total weight of the inventive resist composition.

In case the inventive resist composition comprises inert solvent, the weight content of inert solvent is given as a ratio between the weight content of the inert solvent and the weight content of the remaining constituents of the inventive composition comprising PFPE-based reactive copolymer, reactive diluent, polymerization initiator and optionally further constituents except inert solvents. Further details are set out hereinafter.

According to the first aspect of the present invention the inventive resist composition is characterized in that it comprises or consists of a perfluoropolyether (PFPE)-based reactive copolymer, a suitable reactive diluent and a suitable polymerization initiator.

The perfluoropolyether (PFPE)-based reactive copolymer can preferably be selected from the group consisting of thermally active PFPE or UV-active PFPE-based reactive copolymer.

In a preferred embodiment the PFPE-based reactive copolymer may preferably comprise or consist of the following chemical macro monomer formula (I):

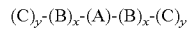

wherein

A represents a perfluoroether oligomer/polymer backbone, preferably perfluoroethyleneglycol, perfluoropropyleneglycol, perfluorobutyleneglycol etc., wherein the backbone is bound to the spacer group (B) and/or the curable unit group (C) by use of suitable reactive groups, preferably selected from hydroxyl, amine, carboxy, thiol or suitable reactive ionic salts thereof, such as sodium salt, potassium salt etc., B represents a spacer group comprising suitable reactive groups for binding to the perfluoroether oligomer/polymer backbone (A) and the curable unit (C), wherein the spacer group preferably independently from each other based comprises aliphatic or aromatic esters, aliphatic or aromatic ethers, and/or aliphatic or aromatic urethanes, x represents an Integer and is independently from each other selected from the group consisting of 0, 1, 2, 3, 4 or more, preferably 0 or 1, C represents independently from each other a thermally or UV-light curable unit suitable for cross linking the PFPE-based reactive copolymer and is preferably independently from each other selected from the group consisting of acrylate, methacrylate or epoxides, more preferably acrylate or methacrylate, most preferably methacrylate, y represents an integer and is independently from each other selected from the group consisting of 1, 2, 3, 4 or more, preferably 1 or 2, more preferably 1.

According to an alternatively or cumulatively preferred embodiment the PFPE-based reactive copolymer can also be selected from the group consisting of thermally active PFPE or UV-active PFPE with structural variations of the above mentioned molecular components to achieve supramolecular architectures like dendrimers, other dendritic or hyperbranched polymers as well as multi-arm star co-polymers. These structural variations may be synthesized through covalent binding of the PFPE parts (group C) to a multifunctional core molecule (group D) comprising respective reactive functionalities to yield in the following formula (II):

wherein

A represents a perfluoroether oligomer/polymer backbone, preferably perfluoroethyleneglycol, perfluoropropyleneglycol, perfluorobutyleneglycol etc., wherein the backbone is bound to the spacer group (B) and/or the curable unit group (C) by use of suitable reactive groups, preferably selected from hydroxyl, amine, carboxy, thiol or suitable reactive ionic salts thereof, such as sodium salt, potassium salt etc, B represents a spacer group comprising suitable reactive groups for binding to the perfluoroether oligomer/polymer backbone (A) and the curable unit (C), wherein the spacer group preferably independently from each other based comprises aliphatic or aromatic esters, aliphatic or aromatic ethers, and/or aliphatic or aromatic urethanes, x represents an integer and is selected from the group consisting of 0, 1, 2, 3, 4 or more, preferably 0 or 1, C represents independently from each other a thermal or UV-light curable unit suitable for cross linking the PFPE-based reactive copolymer and is preferably independently from each other selected from the group consisting of acrylate, methacrylate or epoxides, more preferably acrylate or methacrylate, most preferably methacrylate, y represents an integer and Is selected from the group consisting of 1, 2, 3, 4 or more, preferably 1 or 2, more preferably 1, z represents an integer and is selected from the group consisting of 1, 2, 3, 4 or more, preferably 2, 3, 4 or more and D represents a core unit, preferably a multifunctional core unit, wherein the core unit is bound to the perfluoroether oligomer/polymer backbone of the unit $[(A)-(B)_x-(C)_y]_z$ by use of 1, 2, 3, 4 or more reactive groups, preferably selected from triols, triamines, triacides, triisocyanates.

More preferably the PFPE-based reactive copolymer is selected from compounds of formula (I), more preferably wherein at least one spacer group (B), preferably two spacer groups (B) are present and wherein the curable unit (C) is selected from acrylate and/or methacrylate. Suitable PFPE-based reactive copolymers are presently commercially available, e.g. provided by Solvay Solexis under the trademark of Fomblin® or Fluorolink®.

In a further alternatively or cumulatively preferred embodiment the PFPE-based reactive copolymer may comprise or consist of a molecular weight (Mw) within the range 200-100000 g/mole, preferably 200-50000 g/mole, even more preferably 200-5000 g/mole.

According to a further alternatively or cumulatively preferred embodiment of the inventive resist composition, the weight ratio of the PFPE-based copolymer in the inventive resist composition lies within the range of 20 to 95 wt.-%, preferably 30 to 90 wt.-%, more preferably 40 to 60 wt.-%, more preferably 35 to 50 wt.-% or 60 to 80 wt.-% respectively based on the total weight of the inventive resist composition. As defined herein before, the term "total weight of the inventive resist composition" relates to the total weight of the inventive resist composition, which will be polymerized in the NIL process, in particular which essentially does not comprise inert solvent. In general the higher the content of the PFPE-based copolymer in the inventive resist composition, the better the release properties and the lower the release forces. Accordingly, the inventive resist composition improves a defect-free de-molding of the commonly available stamp material, preferably wherein the stamp material does not comprise an anti-sticking layer.

Furthermore, the inventors have found out that the inventive resist composition exhibits excellent shrinkage values, which does not cause any defects in the Imprinted and cured article, but may facilitate the de-molding in the nanoscale. This can be the reason for the advantageous self-demolding properties of the inventive resist composition. The inventors have found out that the volume shrinkage for ink-jet prototypes is below 10 vol.-% and the volume shrinkage for spin-coating prototypes is below 5 vol.-%. In general, the higher the content of the fluorinated constituents, in particular PFPE-based reactive copolymers, of the inventive resist composition, the lower the shrinkage volume.

The inventive resist composition also generally exhibits a suitable dynamic viscosity ($\eta$) for NIL processes $$\eta = \rho \cdot v$$

where $\rho$ is the density of the inventive resist composition and $v$ is the kinematic viscosity of the inventive resist composition. In the context of the present invention the terms "dynamic viscosity" and "viscosity" are interchangeably used and the dynamic viscosity ($\eta$) is generally measured with rotational viscosimeters at 25° C. Preferably the viscosity measurements are carried out using a Brookfield Rheomoter RS3 applying standard measuring systems and tooling like MS-CC14 DIN/FTK for sample viscosities between 70 and 60000 mPas and MS3-DG DIN for sample viscosities below 50 mPas.

In accordance with the present invention the term "dynamic viscosity" and "viscosity" are used interchangeably. According to a further alternatively or cumulatively preferred embodiment of the present invention, the inventive resist composition exhibits a dynamic viscosity within the range of 1 to 1000 mPas, more preferred 5 to 500 mPas, even more preferred 10 to 200 mPas and further preferred 20 to 100 mPas and, thus, allows suitable quick filling times during NIL processes. The suitable viscosity can be adjusted by use of the suitable reactive diluents and/or inert solvents to be used with respect to the present invention. The inventors have furthermore found out that due to low viscosity of the inventive resist composition, the inventive resist composition can be NIL imprinted without the application of any external pressure. Furthermore, due to the excellent wetting characteristics of the inventive composition the material of the inventive resist composition exhibits low surface energy and, thus, no systematic filling defects have been observed.

The inventive resist compositions, thus, can generally be applied to the substrate in NIL processes by any suitable method, in particular by spray coating, ink-jet coating, drop dispensing, spin-coating, gravure printing, slot-die coating, curtain coating, dip-coating or any other suitable method. Preferably, the inventive resist composition is applied to the substrate by spin coating or ink-jet coating.

In case the inventive resist composition shall in an alternatively or cumulatively preferred embodiment be applied to the substrate by spin coating, then the inventive resist composition preferably comprises 50-95 wt.-%, more preferably 55-90 wt.-%, even more preferred 60-80 wt.-% PFPE-based on the total weight of the inventive resist composition. As defined herein before, the term "total weight of the inventive resist composition" relates to the total weight of the inventive resist composition, which will be polymerized in the NIL process, in particular which essentially does not comprise inert solvent. In general the viscosity of the inventive resist composition to be applied to the substrate by a spin coating method can lie within the range of 20 to 1000 mPas, preferably 50 to 500 mPas, more preferably 100 to 250 mPas.

In case the inventive resist composition shall in an alternatively preferred embodiment be applied to the substrate by fast dispensing techniques, like ink-jet deposition, then the inventive resist composition preferably comprises 20 to 70 wt.-%, more preferably 30 to 65 wt.-%, even more preferably 40 to 60 wt.-% and further preferably 35 to 50 wt.-% PFPE-based on the total weight of the inventive resist composition. As defined herein before, the term "total weight of the inventive resist composition" relates to the total weight of the inventive resist composition, which will be polymerized in the NIL process, in particular which essentially does not comprise inert solvent. Preferably the inventive resist composition suitable for fast dispensing techniques, preferably ink-jet deposition exhibits in addition a viscosity in the range of up to 50 mPas, preferably 15 to 40 mPas, more preferably 20 to 36 mPas, even more preferred 25 to 30 mPas or alternatively 1 to 25 mPas, preferably 10 to 20 mPas.

In accordance with the first aspect of the present invention any suitable reactive diluent for NIL processes may be used with respect to the inventive resist composition. Suitable reactive diluents may facilitate cross-linking of the PFPE-copolymer and/or may facilitate setting the suitable viscosity and/or facilitate improving parameters for subsequent process steps of a resist like dry etching characteristics or wet-chemical solubility important for the removal of the cross-linked resist.

Generally all suitable reactive diluents for polymerization of the PFPE-based polymer, in particular free radical former and/or cationic reactive groups can be used with respect to the first aspect of the present invention. According to a further alternatively or cumulatively preferred embodiment the inventive resist composition comprises one, two, three or four reactive diluents suitable for acrylate/methacrylate curable groups of the PFPE-based reactive copolymer preferably selected from the group consisting of mono or multifunctional aliphatic, cycloaliphatic and/or aromatic acrylate monomers with preferably below 1000 g/mole, such as monoacrylate, diacrylate or triacrylate monomers, or mono or multifunctional aliphatic, cycloaliphatic and/or aromatic methacrylate monomers, such as monomethacrylate, dimethacrylate or trimethacrylate monomers, more preferably aliphatic mono or difunctional acrylic acid ester or methacrylic acid ester, most preferably ester with $C_1$ to $C_5$ alkyl, such as methacrylic acid methylester, methacrylic acid butylester, ethyleneglycol diacrylate, ethyleneglycol dimethacrylate, 1,3-butyleneglycol diacrylate, 1,3-butyleneglycol methacrylate, 1,4-cyclohexanediol diacrylate, 1,4-cyclohexanediol methacrylate, diethyleneglycol dimethacrylate and/or diethyleneglycol diacrylate, most preferably 2-(2-ethoxyethoxyl)ethyl-methacrylate, oxydi-2,1-ethanediylbis-methacrylate[di(ethylene glycol)dimethacrylate], 2-ethyl-2-[[(1-oxoallyl)oxy]methyl]-1,3-propanediyl diacrylate (triacrylate), di(ethylene glycol) ethyl ether acrylate. According to a further alternatively or cumulatively preferred embodiment the inventive resist composition comprises one, two, three or four reactive diluents suitable for epoxide curable groups of the PFPE-based reactive copolymer preferably, selected from the group consisting cycloaliphatic epoxides, glycidyl ether epoxides, lactones, monoepoxide-based reactive diluents, preferably 4-tert-butylphenyl-2,3-epoxypropyl ether; multifunctional epoxide-based reactive diluents, preferably selected from 1,4-bis[(2,3-epoxypropoxy)methyl]cyclohexane, bis(3,4-epoxycyclohexylmethyl)adipate, 2,2-bis[4-(glycidyloxy)phenyl]propane, 1,4-cyclohexanedimethanol diglycidyl ether, bis[4-(glycidyloxy)phenyl]methane, 1,6-hexanediol diglycidyl ether, gamma-butyrolactone, or blends of two, three, four or more constituents as described hereinbefore or mixtures blends of one, two, three, four or more constituents as described hereinbefore together with oxetane-based compounds, preferably bis(1-ethyl(3-oxetanyl)methyl)ether.

The total content of the suitable reactive diluents to be used within the inventive resist composition of the first inventive aspect generally lies within the range of 4.9 to 79.9 wt.-%, preferably 20 to 65 wt.-%, respectively based on the total weight of the Inventive resist composition. As defined herein before, the term "total weight of the inventive resist composition" relates to the total weight of the inventive resist composition, which will be polymerized in the NIL process, in particular which essentially does not comprise inert solvent.

The inventors have also found out that the inventive resist composition generally forms a continuous, stable and homogenous layer after application to a suitable substrate covering a range up to 100 μm, preferably from sub-100 nm to 20 μm, more preferably from 5 nm to 5 μm, more preferably from 10 nm to 1 μm, more preferably from 15 nm to 500 nm, even more preferably from 20 to 200 nm, even more preferably from 25 to 100 nm, even more preferably from 30 to 50 nm layer thickness.

The inventive resist composition is furthermore advantageous, as the inventors have found out that in case the inventive resist composition is applied onto a substrate without adhesion promoter with a layer thickness below 1 μm, preferably below 100 nm, the inventive resist composition layer does not flow for days, even if the substrate is stored vertically. Thus, the inventive resist composition also allows imprinting of an applied inventive resist layer after storage for days, preferably 3 days without any change in the material of the inventive resist composition and the imprinting properties thereof.

The stability of the imprinted inventive resist composition is increased by any suitable curing method (thermal or photochemical) and, thus, cross-linking of the resist material. The inventive resist composition allows curing in seconds. The higher the content of the curable units, e.g. acrylate, methacrylate and/or epoxide, the faster the inventive resist composition can be cured.

According to the present invention, any suitable polymerization initiator for NIL processes may be used for curing of the inventive resist composition. Preferably one, two or more, more preferably two suitable polymerization initiators can be used for the inventive resist composition, which facilitate the cross-linking of PFPE-copolymer and the suitable reactive diluents. Preferably a mixture of two or more polymerization initiators is selected to broaden the suitable curing conditions, such as wavelengths or temperature ranges. Suitable polymerization initiators may be radical formers or photo acid generators and can preferably be selected from the group consisting of thermal initiators or photo initiators, preferably UV-sensitive photo initiators. With respect to the present invention one, two or more, preferably two photo initiators, in particular UV-sensitive photo initiators are preferably used as the suitable polymerization initiator.

According to a preferred embodiment the thermal initiator of the inventive resist composition is selected from the group consisting of diacyl peroxides, preferably selected from the group consisting of dibenzoyl peroxide, dilauroyl peroxide, or didecanoyl peroxide; peroxydicarbonates, preferably di(4-tert-butylcyclohexyl) peroxydicarbonate; peroxyesters, preferably tert-butyl peroxybenzoate; peroxyketals, preferably selected from the group consisting of 1,1-bis(tert-butylperoxy)cyclohexane or 2,2-bis(tert-butylperoxy)butane; dialkylperoxides, preferably bis(1-methyl-1-phenylethyl)peroxide or di-tert-butyl peroxide; alkyl hydroperoxides, preferably tert-butyl hydroperoxide; azo initiators, preferably 2,2'-azobis(2-methylpropionitrile) or 4,4-azobis(4-cyanovaleric acid); or blends of two, three, four or more constituents as described hereinbefore, or blends of two, three, four or more constituents as described hereinbefore with amine synergists, preferably diethyl aniline or dimethyl-p-toluidine.

According to a preferred embodiment the photo initiator of the inventive resist composition is selected from the group consisting of benzophenone; alpha-hydroxyketones, preferably 2-hydroxy-2-methyl-1-phenyl-1-propanone; benzyldimethyl-ketals, preferably alpha,alpha-dimethoxy-alpha-phenylacetophenone; alpha-aminoketones, preferably 2-methyl-1-(4-(methylthio)phenyl)-2-(4-morpholinyl)-1-propanone; phenylglyoxolates, preferably oxy-phenyl-acetic acid 2-(2-oxo-2phenyl-acetoxy-ethoxy)-ethyl ester; mono or bis acyl phosphines, preferably diphenyl(2,4,6-trimethylbenzoyl)phosphine oxide; metallocenes, preferably bis(eta-5-2,4-cyclopentadien-1-yl)bis[2,6-difluoro-3-(1H- pyrrol-1-yl)phenyl]titanium; or blends of two, three, four or more constituents as described hereinbefore, or blends of two, three, four or more constituents as described hereinbefore together with amine synergists, preferably selected from the group consisting of methyl diethanol amine, dibutyl ethanol amine, triethyl amine, or triethanol amine, ethyl-p-dimethylamino benzoate, octyl-p-dimethylamino benzoate; or blends of two, three, four or more constituents as described hereinbefore together with acrylated amine synergists, preferably acrylated amine oligomers; or blends of two, three, four or more constituents as described hereinbefore together with sensitizers, preferably 2-isopropylthioxanthone or 4-isopropylthioxanthone.

According to a preferred embodiment the photo initiator of the inventive resist composition is selected from the group consisting of phenylphosphineoxides or diphenylethan-1-ones or photo initiators with equivalent properties, preferably bis(2,4,6-trimethylbenzoyl)-phenylphosphineoxide (IRGACURE® 819) and 2,2-dimethoxy-1,2-diphenylethan-1-one (IRGACURE® 651).

The total content of the polymerization initiators within the inventive resist composition lies preferably within the range of 0.1 to 10 wt.-%, more preferably 0.1 to 5 wt.-%, even more preferably 0.2 to 2 wt.-%, even more preferably 0.3 to 1.5 wt.-%, even more preferably 0.5 to 1 wt.-% based on the total weight of the inventive resist composition. As defined herein before, the term "total weight of the inventive resist composition" relates to the total weight of the inventive resist composition, which will be polymerized in the NIL process, in particular which essentially does not comprise inert solvent.

According to the present invention the inventive resist composition can furthermore comprise one, two, three or more suitable inert solvents for providing good film forming properties, preferably one inert solvent is used. Thus, the inventive resist composition may be commercialized in a solvent-free form or in a solvent-containing form. Suitable inert solvents may facilitate fine adjustment of the layer thickness in particular for spin coating applications and/or may facilitate dilution of the inventive resist composition in order to be ink-jet dispensable. In case the inventive resist composition comprises inert solvent, the solvent-containing form of the inventive resist composition is applied to the substrate and prior to the imprinting step of the NIL process the solvent is essentially removed by suitable methods, preferably by raising the temperature above the boiling point of the respective solvent or solvent mixture (generally known in the art as "prebaking" step). Thus, the remaining constituents of the inventive resist composition, which does not comprise inert solvents, are imprinted and cured when conducting the NIL processes.

According to a further alternatively or cumulatively preferred embodiment the inventive resist composition comprises one, two, three or more different suitable inert solvents, preferably one inert solvent selected from the group consisting of ketones, preferably selected from the group consisting of acetone, methyl ethyl ketone, methyl isobutyl ketone (MIBK), N-methyl-2-pyrrolidone (NMP), N-ethyl-2-pyrrolidone (NEP), 2-pentanone, 3-pentanone, cyclopentanone, cyclohexanone and γ-butyrolactone (GBL), preferably high purity GBL; ethers, preferably 1,3-dioxolane; and esters, preferably selected from the group consisting of 2-ethoxyethyl acetate, 2-methoxypropyl acetate, ethyl lactate, and 2-ethoxyethylpropionate, propylene glycol monomethyl ether acetate (PGMEA); or other inert solvents such as ethanol; or blends of two, three, four or more inert solvents as described hereinbefore. More preferably the one or more inert solvents are selected from the group consisting of acetone, methyl isobutyl ketone (MIBK), propylene glycol monomethyl ether acetate (PGMEA), ethanol and N-methyl-2-pyrrolidone (NMP), even more preferably selected from the group consisting of methyl isobutyl ketone (MIBK), propylene glycol monomethyl ether acetate (PGMEA) and N-methyl-2-pyrrolidone (NMP).

According to an alternatively or cumulatively preferred embodiment, the inventive resist composition preferably does not contain inert solvent. Such a preferred embodiment is advantageous, as no removal of inert solvent needs to be conducted.

In case the inventive resist composition to be commercialized comprises inert solvent, the total content of the inert solvents is generally within the range of 999:1 to 1:999, preferably 99:1 to 1:99, more preferably 9:1 to 1:9, even more preferably 5:1 to 1:5, even more preferably 2:1 to 1:2, even more preferably 1.5:1 to 1:1 parts inert solvent (weight):remaining constituents of inventive resist composition except inert solvent (weight).

The surface energy of the inventive resist may directly be dependent on the surface energy of the direct contact material of the substrate and/or the stamp. In general, the fluorinated constituents, in particular the PFPE-based reactive copolymers, of the inventive resist composition tend to immigrate to the surface of the inventive resist composition, which minimizes the overall surface energy of the applied layer or drop of the inventive resist composition. The fluoro-enriched surface of the inventive resist composition may thus contain up to 80:1 fluorinated constituents, in particular PFPE-based reactive copolymers, in comparison to the overall content of the inventive resist composition.

Depending on the surface energy of the direct contact material of the substrate and/or the stamp, the Inventive resist composition can exhibit different concentrations of fluorinated material on the surface (see FIG. 1 in detail explained in part D of the example section).

In a preferred alternative or cumulative embodiment of the present invention, the inventive resist composition further comprises or consists of one, two, three or more additives suitable to increase the oxygen tolerance, preferably the one, two, three or more additives are selected from the group consisting of reactive monomers comprising thiol additives suitable for thiolene polymerization, preferably selected from the group consisting of multifunctional thiols, more preferably selected from tetra-(3-mercaptopropionate) pentaerythritol, trimethylpropane tri(3-mercaptopropionate) and pentaerythritol tetramercaptoacetate.

The inventors in addition found out that the inventive resist compositions can also be used for removing impurities present, preferably of remaining inventive resist composition material on the stamp during the curing step. Thus, the inventive resist composition is in particular advantageous in high throughput NIL processes, such as step and repeat processes, as it facilitates self-removal of remaining inventive resist material and, thus, reduces the defect-rate of the imprinted resist articles in continuous processes.

The inventors furthermore found out that the inventive resist composition exhibits a suitable etch stability in the meaning of thermal stability and/or etch selectivity for NIL processes, in particular under conditions for dry etching, like isotropic oxygen plasma etching, anisotropic reactive ion etching (RIE), inductively coupled plasma (ICP) process, or the Bosch process, as well as physical etching techniques like ion milling.

In case that the thermal and/or mechanical stability of the inventive resist composition needs to be increased, the inventive resist composition preferably further comprises or consists of one, two, three or more suitable additives, preferably one, two, three or more aromatic and/or silicon containing acrylic and/or methacrylic monomers are added to the inventive resist composition, preferably selected from the group consisting of dipentaerythritol pentaacrylate, dipentaerythritol hexaacrylate, di(trimethylolpropane)tetraacrylate, pentaerythritol tetraacrylate and tris[2-(acryloyloxy)ethyl]isocyanurate or blends thereof.

The inventive resist composition generally exhibits an etch selectivity against Si of at least 1:1, which under appropriate conditions can be extended to more than 1:10. To increase the etch selectivity the inventive resist composition can further comprise or consist of one, two, three or more suitable additives, preferably Si containing monomers and/or constituents with a higher content of aromatic units, or alicyclic compounds, or multifunctional components which increase the cross-linking density, more preferably selected from the group consisting of multifunctional acrylates, preferably selected from the group of methacrylates, dipentaerythritol pentaacrylate, dipentaerythritol hexaacrylate, di(trimethylolpropane)tetraacrylate, pentaerythritol tetraacrylate, tris[2-(acryloyloxy)ethyl]isocyanurate; and alicyclic compounds, preferably selected from tricyclododecane dimethanol diacrylate, isobornyl methacrylate and isobornyl acrylate.

According to the present invention the inventive resist composition exhibits excellent wetting properties and forms continuous, stable and homogenous layers after application to the substrate. The inventors have furthermore found out that inventive resist compositions may already comprise a suitable adhesion to the substrate so that no use of adhesion promoters is needed. It could be shown that with and without the use of adhesion promoters the applied inventive resist composition exhibits a long-time stability, so that it can be stored a couple of days, preferably 3 days without dewetting. Even after such storage times the coated inventive resist composition can be processed successfully, allowing suitable curing conditions and the above mentioned release at sub-100 nm resolution for stamps without ASL and sub-20 nm resolution for stamps with ASL. As an example an excellent resolution of 15 nm was achieved easily on a 2×2 cm$^2$ Si stamp without any defects. In addition the inventors have found out that the inventive resist composition may exhibit already a suitable adhesion to the substrate so that no further adhesion promoter needs to be applied to the substrate.

The inventors furthermore found out that the inventive resist composition can—due to the tenside-like character of its constituents—further comprise or consist of one, two, three or more different conductive and/or non-conductive nanoparticles and/or nanocrystals. Suitable nanoparticles and/or nanocrystals can tune the refractive index and/or increase the scratch resistance and/or make the imprinted resist article applicable for photonic applications.

Accordingly, as an alternatively or cumulatively preferred embodiment the inventive resist composition furthermore comprises or consists of suitable conductive nanoparticles and/or nanocrystals, which facilitate the photonic, in particular nanophotonic application of the imprinted resist article. In this case the conductive nanoparticles and/or nanocrystals are preferably selected from one, two, three or more different groups of suitable conductive nanoparticles and/or nanocrystals, preferably selected from of silver (Ag), copper (Ku), gold (Au), aluminum (Al), calcium (Ca), tungsten (W), zinc (Zn), nickel (Ni), lithium (Li), iron (Fe), platinum (Pt), tin (Sn), lead (Pb) and titanium (Ti), preferably silver (Ag), copper (Ku), gold (Au) and aluminum (Al).

According to an alternatively or cumulatively preferred embodiment the inventive resist composition furthermore comprises or consists of suitable non-conductive nanoparticles and/or nanocrystals, which facilitate the adjustment of the refractive index and/or increase of the scratch resistance of the imprinted resist article. In this case the non-conductive nanoparticles and/or nanocrystals are preferably selected from one, two, three or more different groups of suitable non-conductive nanoparticles and/or nanocrystals, preferably selected from the group consisting of oxides, preferably the same or different oxides selected from the group consisting of CaO, ZnO, CdO, SiO$_2$, TiO$_2$, ZrO$_2$, CeO$_2$, SnO$_2$, PbO, AlO, In$_2$O$_3$ and La$_2$O$_3$; sulfides, preferably the same or different sulfides selected from the group consisting of CdS and ZnS; selenides, preferably the same or different selenides selected from the group consisting of GaSe, CdSe and ZnSe; tellurides, preferably the same or different tellurides selected from the group consisting of ZnTe and CdTe; halogenides, preferably the same or different halogenides selected from the group consisting of NaCl, KCl, BaCl$_2$, AgCl, AgBr, AgI, CuCl, CuBr, CdI$_2$ and Cd$_3$P$_2$; and carbonates, preferably the same or different carbonates selected from the group consisting of Na$_2$CO$_3$, K$_2$CO$_3$, CaCO$_3$, SrCO$_3$, BaCO$_3$.

According to a further alternatively or cumulatively preferred embodiment the inventively suitable nanoparticles and/or nanocrystals exhibit any suitable particle size, preferably the particle size of the inventively suitable nanoparticles and/or nanocrystals lies in the range of 1 to 500 nm, more preferably 2 to 250 nm, even more preferably 5 to 100 nm, even more preferably 7 to 50 nm, even more preferably 10 to 30 nm.

The preferred embodiments of the inventive resist composition of the first inventive aspect as set out hereinbefore can be alternatively or cumulatively combined with each other, provided that the combination is reasonable. A person skilled in the art will readily understand which combinations are reasonable.

According to the second aspect of the invention the inventive resist composition can be used as a resist in nanoimprint lithography processes. Any available nanoimprint lithography process or reverse nanoimprint lithography process can be used, in particular including standard thermal and UV-based NIL (T-NIL and UV-NIL) processes as well as advanced step-and-repeat (S&R) or roller-based methods, such as roll-to-plate (R2P) or roll-to-roll (R2R) methods with thermal and UV-based nanoimprint steps as patterning technology.

All preferred embodiments of the Inventive resist composition of the first aspect of the invention can be used with respect to the second aspect of the invention.

According to the third aspect of the invention the inventive resist composition can be used to manufacture a stamp material (mold) for use in a nanoimprint lithography process. In this respect the inventive resist composition is imprinted by use of a NIL process and the imprinted resist article comprises a negative copy of the topography of the master stamp. The imprinted resist article made of the inventive resist composition comprising the negative copy of the master stamp is generally transparent and can be used as a one-time- or multiple-time usable UV-stamp in a further NIL process. Preferably, the manufactured stamp, more preferably UV-stamp is not treated with further suitable agents, preferably anti-sticking-layer (ASL) to facilitate de-molding.

All preferred embodiments of the inventive resist composition of the first aspect of the invention and the uses thereof in accordance with the second and third aspect of the invention can be used with respect to the third aspect of the invention.

According to the fourth aspect of the invention the process of production of an inventive resist composition is characterized in that a perfluoropolyether (PFPE)-based reactive copolymer, a suitable reactive diluent and a suitable polymerization initiator are suitably admixed. Preferably the components of the inventive resist composition are admixed at ambient temperature (appr. 25° C.) and if necessary one or more of the suitable inert solvents are optionally used to manufacture the inventive resist composition.

All preferred embodiments of the inventive resist composition of the first aspect of the Invention and the uses thereof in accordance with the second and third aspect of the invention can be used with respect to the fourth aspect of the invention.

According to a preferred embodiment of the fourth aspect of the invention, the production of the inventive resist composition is characterized in that in step a) one, two, three or more of the suitable polymerization initiators according to the first aspect of the invention are provided, preferably at ambient temperatures, in step b) one, two, three, four or more suitable reactive diluents according to the first aspect of the invention are admixed with the polymerization initiators provided in step a), preferably at ambient temperature, more preferably the admixture is stirred, preferably with magnetic or other mechanical stirrers until complete dissolution of the mixture, in step c) one or more suitable PFPE-based reactive copolymers in accordance with the first aspect of the invention are admixed to the mixture of step b), preferably at ambient temperatures, more preferably the resulting inventive resist composition is preferably stirred until complete miscibility of the components is observed, and optionally, in step d) the clear solution of the inventive resist composition in step c) is filtered, preferably using a membrane or capsule filter, most preferably wherein the filter is made of Nylon-based or PTFE-based materials. The optional filtration step facilitates removal of particle impurities with a size down to the sub 100 nm range depending on the pore size of the filter.

The ready-to-use solution of the inventive resist composition can generally be applied by any suitable method, in particular by spray coating, ink-jet coating, drop dispensing, spin-coating, gravure printing, slot-die coating, curtain coating, and dip-coating.

In case the layer of the inventive resist composition on the substrate shall be tuned or the viscosity of the inventive resist composition shall be adjusted to be ink-jet dispensable the one, two, three or more polymerization initiators are alternatively or cumulatively preferably admixed in step a) with suitable inert solvents according to the first aspect of the invention, preferably selected from the group consisting of acetone, anisole, methyl isobutyl ketone (MIBK), propylene glycol monomethyl ether acetate (PGMEA), ethanol, N-methyl-2-pyrrolidone (NMP), N-ethyl-2-pyrrolidone (NEP), more preferably methyl isobutyl ketone (MIBK), propylene glycol monomethyl ether acetate (PGMEA) and N-methyl-2-pyrrolidone (NMP). After application of the solvent containing inventive resist composition to the substrate, the inert solvent is removed prior to imprinting and curing the inventive resist composition.

According to the fifth aspect of the invention the process of production of an imprinted resist article by use of nanoimprint process, preferably nanoimprint lithography process, comprises or consists of the following steps:
  a. providing a substrate suitable for nanoimprint processes, preferably nanoimprint lithography processes,
  b. applying a suitable amount of the inventive resist composition on at least part of the surface of the substrate provided in step a),
  c. providing a stamp suitable for nanoimprint processes, preferably nanoimprint lithography processes and imprinting and curing the inventive resist composition applied to the substrate in step b) to generate a negative copy of the stamp topography on the resist and
  d. subsequently releasing the stamp from the imprinted inventive resist composition to set free an imprinted resist article.

All preferred embodiments of the inventive resist composition of the first aspect of the invention and the uses thereof in accordance with the second and third aspects of the invention as well as the production of the inventive resist composition in accordance with the fourth aspect of the invention can be used with respect to the fifth aspect of the invention.

In accordance with the fifth aspect of the present invention, any suitable substrate can be used in step a), which allows depositing, imprinting and curing of layers and/or droplets of the inventive resist composition and preferably allows etching of the imprinted inventive resist composition and the substrate. Preferably, the substrate is selected from the group consisting of optionally functionalized inorganic glass, silicon (Si) wafers, metalized wafers, quartz, black Si, and polymers, such as poly carbonate, polyethylene terephthalate (PET), poly(methyl methacrylate) (PMMA) as well as lift-off polymers like polymethyl glutarimide (PMGI). In a preferred embodiment the substrate is surface treated with suitable adhesion promoters, e.g. mr-APS1 (micro resist technology GmbH, Berlin, Germany), which further increases the wetting properties of the inventive resist composition.

Due to the suitable properties of the inventive resist composition the substrate must not only be rigid, but can also be flexible, i.e., stretchable and/or bendable polymers, in particular when applied by ink-jet deposition. Flexible polymer substrates are preferred for new applications, e.g., for flexible micro optical displays or photovoltaic devices, such as solar cells, on flexible polymers, displays, OLEDs, TFTs, etc.

According to step b) of the inventive production process of inventively obtainable imprinted resist articles, the inventive resist composition can be applied to the substrate by suitable means, such as spray coating, ink-jet coating, drop dispensing, spin-coating, gravure printing, slot-die coating, curtain coating, dip-coating and any other suitable method. If the layer thickness of the inventive resist composition is below 1 µm, preferably sub 100 nm, the inventive resist composition layer does not flow for days, even if the substrate does not comprise an adhesion promoter and furthermore even if this substrate is stored vertically. The inventive resist composition also allows imprinting of an applied layer after storage for days, preferably 3 days without any change in the material of the inventive resist composition and the imprinting properties thereof.

In case the inventive resist composition comprises inert solvent, the inert solvent is removed by suitable means from the applied inventive resist composition layer or drop prior to conducting imprinting and curing of the inventive resist composition in step c) of the inventive process of the fifth aspect of the present invention. Suitable means for removing the inert solvent from the applied inventive resist composition generally comprise increase of the temperature close to or above boiling point of the inert solvent or the solvent mixture (also called in the art "prebake" step). The prebaking step removes the residual solvent in the applied inventive resist composition and also enhances the adhesion between resist and the substrate.

As an example, when applying solvent containing inventive resist composition to the substrate by spin-coating suitable layer thickness ranges can be obtained on 5 cm and 10 cm round wafers and at 3000 rpm on a spin-coater for 30 seconds and prebaking at 60-150° C. for 1 minute.

In case the inventive resist composition is deposited on the substrate by ink-jet deposition, then the amount of material is deposited either according to the best-practice of the producer or according to the common practice at the end-user level.

The ink-jet deposited droplets of the Inventive resist can serve as a microlens provided that the optical properties of the inventive resist is suitable for the aimed optical functionality. The geometry and, thus, the optical properties of the inventively obtainable ink-jet deposited resist articles can furthermore be tuned as desired by amending the surface properties of the substrate. When applying the inventive resist composition by ink-jet deposition the amount of the inventive resist composition can be exactly measured, furthermore it may be advantageous for some applications that the diameter of the droplet can be tuned amending the hydrophilicity of the substrate surface, e.g. by reducing the hydrophilicity the contact angle between the inventive resist composition and the substrate surface will typically be increased and, accordingly, the diameter of the droplet will be reduced, leading to an increased resolution of the produced imprinted resist article. The hydrophilicity of the substrate surface can be adjusted with conventional wet-chemical methods, by plasma treatment, or heating at different temperatures, or preferably by functionalizing the surface with self assembled monolayers (SAM), more preferably with trichloro(1H,1H,2H,2H-perfluorooctyl)silane optionally in combination with octyldecyltrimethoxysilane.

Solvent-free inventive resist compositions can deliver 1-20 μm thick homogenous layers at 3000 rpm for 30 seconds on spin-coater on various substrates like silicon or quartz. The layer thickness of the diluted inventive resist compositions comprising one or more of the suitable inert solvents in accordance with the first aspect of the invention can vary between 10 nm to 10 μm depending on the dilution ratio of the reactive mass in the solvent. The thickness of the spin-coated layers may depend on the surface characteristics, e.g. substrate material, roughness, or pretreatment steps like plasma activation or drying at elevated temperatures.

According to step c) an imprinting stamp (nanoimprinting mold) is provided and the inventive resist composition is imprinted. The stamp material can preferably be selected from the group consisting of Silicon (SI), glass/quartz, Nickel (Ni), polydimethylsiloxane (PDMS) and its derivatives, ethylene tetrafluoroethylene (ETFE), polytetrafluoroethylene (PTFE), cyclic olefin copolymer (COC), polyurethane acrylate-based polymers (PUA, e.g. MINS-311RM, Minuta Technology Co., Ltd., Osan, Korea), and/or organic-inorganic hybrid materials (e.g., OrmoStamp®, micro resist technology GmbH, Berlin, Germany), or stack assemblies of the hereinbefore mentioned materials on rigid or flexible carrier materials, like plastic foils or glass backplates, preferably comprising one or more further coatings or layers for adhesion promotion or for enhanced physical or optical functionality, such as a stack comprising or consisting of tridecafluoro-(1,1,2,2)-tetrahydrooctyl-trichlorosilane (F13-TCS), an organic-inorganic hybrid polymer, preferably OrmoStamp® (micro resist technology GmbH, Berlin, Germany), adhesion promoter, preferably OrmoPrime®08 OrmoStamp® (micro resist technology GmbH, Berlin, Germany), an oxygen-barrier layer and a flexible polymer foil or a stack comprising or consisting of tridecafluoro-(1,1,2,2)-tetrahydrooctyl-trichlorosilane (F13-TCS), an organic-inorganic hybrid polymer, preferably OrmoStamp® (micro resist technology GmbH, Berlin, Germany), polydimethylsiloxane (PDMS) and a glass backplane. The stamp may comprise a fluorinated anti-sticking layer to increase the de-molding properties. As the inventors have shown that the inventive resist composition can perform a defect-free imprinting in NIL processes at sub-20 nm resolution using above mentioned stamp material without anti-sticking layer, the stamp material may preferably not comprise such an anti-sticking layer.

The imprinting stamp may comprise different surface topographies, which are negative copied through an intimate contact into the inventive resist composition layer. The generated copy in the inventive resist composition is the negative profile of the master stamp. The inventive resist composition has a suitable viscosity prior to imprinting, so that it facilitates a defect-free filling of the stamp protrusions at room temperature. The complete filling is also facilitated by generating an imprint pressure, where the substrate and stamp are pressed against each other gently. Depending on the viscosity of the inventive resist material or the resolution of the structures more or less pressure may be needed. Preferably the inventive resist composition, preferably exhibiting a dynamic viscosity of 500 mPas or less and/or exhibiting a resolution sub-100 nm, more preferably 100 nm or more, allows pressure-free imprinting.

After the stamp and the inventive resist composition are in contact, the cross-linking reaction is generally activated by either applying suitable temperature or radiation, preferably by exposing UV light through the transparent substrate or the transparent stamp, or by heating the substrate-resist-stamp assembly to the desired imprinting temperature.

After the curing reaction is completed, the stamp is subsequently separated from the inventive resist composition to set free the inventive imprinted resist article in step d) of the inventive process, wherein the inventive resist may subsequently be used in connection with the substrate or may be removed from the substrate. The cured resist is generally a chemically cross-linked solid and the generated structure on the resist side is preserved because of the gained mechanical stability upon curing.

The suitable curing energy per area for UV-curing depends on the thickness of the resist, and generally varies between 15 mJ/cm$^2$ and 600 mJ/cm$^2$, preferably 15-500 mJ/cm$^2$, more preferably 15-400 mJ/cm$^2$, even more preferably 15 to 100 mJ/cm$^2$, even more preferably 15 to 50 mJ/cm$^2$.

The refractive index of the inventive resist composition of the first aspect of the invention as well as the inventive manufactured imprinted resist article according to the fifth aspect of the invention generally lies within the range of 1.3 and 1.6. In generally, the higher the content of the fluorinated constituents, preferably the PFPE-based reactive copolymers, in the inventive composition, the lower the refractive index of the inventive resist composition or the inventive imprinted resist article, whereby the refractive index of the inventive resist composition in fluid form may differ from the refractive index of the inventively manufactured imprinted resist article.

According to the sixth aspect of the invention the inventive imprinted resist article is obtainable by the inventive nanoimprint process, preferably nanoimprint lithography process in accordance with the fifth aspect of the invention.

All preferred embodiments of the inventive resist composition of the first aspect of the invention and the uses thereof in accordance with the second and third aspect of the invention as well as the production of the inventive resist composition in accordance with the fourth aspect of the invention and the production method of the imprinted resist article in accordance with the fifth aspect of the invention can be used with respect to the sixth aspect of the invention.

According to the seventh aspect of the invention the process of production of a nanopatterned and/or nanoprocessed substrate article by use of nanoimprint lithography process comprises or consists of the following steps:

a. providing a substrate suitable for nanoimprint lithography processes,
b. applying a suitable amount of the inventive resist composition on at least part of the surface of the substrate provided in step a),
c. providing a stamp suitable for nanoimprint lithography processes and imprinting and curing the inventive resist composition applied to the substrate in step b) to generate a negative copy of the stamp topography on the resist,
d. releasing the stamp from the imprinted inventive resist composition to set free an imprinted resist article on the substrate and
e. subsequently using at least a part of the imprinted resist article as an etch mask to produce a nanopatterned substrate article comprising at least part of a positive copy of the topography of the imprinted resist article and/or
f. subsequently etching a part of the imprinted resist article and using the partly etched imprinted resist article as a deposition mask to deposit a further material to the substrate to produce a heterogeneous nanoprocessed substrate article.

All preferred embodiments of the inventive resist composition of the first aspect of the invention and the uses thereof in accordance with the second and third aspects of the invention as well as the production of the inventive resist composition in accordance with the fourth aspect of the invention can be used with respect to the seventh aspect of the invention. In particular the process steps a) through d) of the inventive process according to the seventh aspect of the invention are preferably carried out in accordance with process steps a) through d) of the inventive process according to the fifth aspect of the invention.

According to process step e) of the inventive process for production of a nanopatterned substrate article at least part of the imprinted resist article is used as an etch mask preferably for generating at least part of a positive copy of the imprinted resist article topography into the substrate by etching at least part of the imprinted resist article to produce the nanopatterned substrate article, wherein the inventive nanopatterned substrate article comprises the substrate and optionally part of the imprinted resist article.

Any suitable etching method can be applied to remove at least part of the imprinted resist article and to generate the positive copy of the imprinted resist article topography into the substrate, preferably conditions are applied for dry etching, like isotropic oxygen plasma etching, anisotropic reactive ion etching (RIE), inductively coupled plasma (ICP) process, or the Bosch process, as well as physical etching techniques like ion milling.

The inventive resist generally exhibit an etch selectivity against Si of at least 1:1, which under appropriate conditions can be extended to more than 1:10. Suitable additives are described with respect to the first aspect of the present invention.

According to an alternatively or cumulatively preferred embodiment at least part of the imprinted resist article can according to process step f) is removed by etching. The substrate may be patterned or not. Any suitable etching method as described hereinbefore with respect to process step e) can be used. At least part of the remaining imprinted resist article is subsequently used as a deposition mark for depositing a further material, preferably a metal to the substrate to produce a heterogeneous nanoprocessed substrate article, wherein the inventive nanoprocessed substrate article comprises at least part of the substrate material, at least part of the further material, preferably a metal and optionally part of the remaining imprinted resist article.

According to the eighth aspect of the invention the inventive nanopatterned and/or nanoprocessed substrate article is obtainable by the inventive nanoimprint lithography process in accordance with the seventh aspect of the invention.

All preferred embodiments of the inventive resist composition of the first aspect of the invention and the uses thereof in accordance with the second and third aspect of the invention as well as the production of the inventive resist composition in accordance with the fourth aspect of the invention and the production method of the imprinted resist article in accordance with the fifth aspect of the invention as well as the production method of the nanopatterned substrate article in accordance with the seventh aspect of the present invention can be used with respect to the eighth aspect of the invention.

According to the ninth aspect of the invention the inventive imprinted resist article of the sixth aspect of the invention or the nanopatterned and/or nanoprocessed substrate article according to the eighth aspect of the invention can be used for integrated circuits (IC); integrated optics; nanophotonic devices; photovoltaic devices, preferably solar cells; bit-patterned media; displays, preferably TFT-displays; diodes, preferably light emitting diodes (LED) or organic light emitting diodes (OLED); (bio)sensors and/or lab-on-chip devices.

The present invention is described in the following on the basis of exemplary embodiments, which merely serve as examples and which shall not limit the scope of the present protective right.

EXAMPLES

A: Production of a Solvent-Free Inventive Resist Composition

Executive Examples 1 to 4 Suitable for Spin Coating

The reactive mass of the inventive resist composition comprises the PFPE-based copolymer, suitable UV-reactive or thermally reactive diluents and a suitable initiator. The solvent-free formulation of the inventive resist composition indicated for spin coating can be prepared at ambient temperature without need for heating. The initiator can be chosen according to the desired initiation wavelength for the photopolymerization/curing reaction or according to the desired temperature range at which a thermal polymerization/curing reaction has to take place during imprinting.

For example a 1000 grams batch of a solvent-free UV-active inventive resist composition with a viscosity of 300 mPas is prepared as follows:

In the best practice a colored glass flask is used for UV light protection, which is equipped with a magnetic stirrer. 200 grams of the reactive diluent (dimethacrylate) is poured in the glass flask. 20 grams of the photo initiator 2,2-dimethoxy-1,2-diphenylethan-1-one is dissolved in the reactive diluent for 60 minutes at 250 rpm on the magnetic stirrer with no heating. 780 grams of PFPE-based copolymer is added subsequently and stirred for 4 hours until complete dissolution. The clear solution is filtered using membrane filters or capsule filters made of Nylon-based or PTFE-based materials. This removes particle impurities with a size down to the sub 100 nm range depending on the pore size of the filter.

As PFPE-based copolymer, reactive diluent and photo initiator all suitable as well as preferred materials disclosed with respect to the first aspect of the present invention can be used. Preferably the PFPE-based copolymer comprises a spacer group and one or two curable units, preferably selected from acrylate, methacrylate and/or epoxide.

Alternatively, the reactive components can also be thermally cured. In this case, the photo initiator is substituted by a suitable thermal initiator, preferably benzoyl peroxide.

The individual features of the aforementioned executive example can independently from each other be inventively combined with the inventive embodiments of the general description.

The following exemplary embodiments have been produced in accordance with the hereinbefore described production instructions of part A, example 1, wherein the percentage values refer to the percentage weight amount of the respective component based on the total weight of the inventive resist composition.

Formulations of solvent-free spin-coating samples (high-viscosity compositions) of the inventive resist composition:

| Executive example | PFPE wt.-% | Dimethyl- acrylate wt.-% | Tri- acrylate wt.-% | Di- acrylate wt.-% | Initiator wt.-% | Mono- acrylate | Monometh- acrylate |
|---|---|---|---|---|---|---|---|
| 1 | 76 | 20 | — | — | 2 | — | — |
| 2 | 80 | 10 | 9 | — | 1 | — | — |
| 3 | 60 | 26 | — | 13 | 1 | — | — |
| 4 | 72 | 17 | 9 | — | 2 | — | — |
| 5 | 90 | 9 | — | — | 1 | — | — |
| 6 | 80 | 19 | — | — | 1 | — | — |
| 7 | 70 | 29 | — | — | 1 | — | — |
| 8 | 60 | 39 | — | — | 1 | — | — |

Executive Examples 9 to 14 Suitable for Ink-Jet Dispensing

A 1000 grams batch of solvent-free UV-active inventive resist composition with a viscosity of ≤50 mPas is prepared as follows:

In the best practice a colored glass flask is used for UV light protection, which is equipped with a magnetic stirrer, 630 grams of the reactive diluent (dimethacrylate) is poured in the glass flask. 20 grams of the photo initiator 2,2-dimethoxy-1,2-diphenylethan-1-one is dissolved in the reactive diluent for 60 minutes at 250 rpm on the magnetic stirrer with no heating. 350 grams of PFPE-based reactive copolymer is added subsequently and stirred for further 4 hours until complete dissolution. The clear solution is filtered using membrane filters or capsule filters made of Nylon-based or PTFE-based materials. This removes particle impurities with a size down to the sub 100 nm range depending on the pore size of the filter.

As PFPE-based copolymer, reactive diluent and photo initiator all suitable as well as preferred materials disclosed with respect to the first aspect of the present invention can be used. Preferably the PFPE-based copolymer comprises a spacer group and one or two curable units, preferably selected from acrylate, methacrylate and/or epoxide.

Alternatively, the reactive components can also be thermally cured. In this case, the photo initiator is substituted by a suitable thermal initiator, preferably benzoyl peroxide.

The individual features of the aforementioned executive example can independently from each other be inventively combined with the Inventive embodiments of the general description.

The following exemplary embodiments have been produced in accordance with the hereinbefore described production instructions of part A, example 9, wherein the percentage values refer to the percentage weight amount of the respective component based on the total weight of the inventive resist composition.

Formulations of solvent-free ink-jet samples (low-viscosity compositions) of the inventive resist composition:

| Executive example | PFPE wt.-% | Dimethyl-acrylate wt.-% | Tri-acrylate wt.-% | Di-acrylate wt.-% | Initiator wt.-% | Mono-acrylate | Monometh-acrylate |
|---|---|---|---|---|---|---|---|
| 9 | 35 | 63 | — | — | 2 | — | — |
| 10 | 44 | 55 | — | — | 1 | — | — |
| 11 | 50 | 49 | — | — | 1 | — | — |
| 12 | 38 | 40 | — | — | 2 | 20 | — |
| 13 | 35 | 43 | — | — | 2 | 20 | — |
| 14 | 35 | 43 | — | — | 2 | — | 20 |

B: Production of an Inventive Resist Composition Comprising Inert Solvent

Executive Example 15

A 1000 grams batch of a ready-to-use mixture of a UV-active inventive composition, which delivers a 500 nm thick layer at 3000 rpm on the spin coater on a silicon wafer is prepared as follows:

In the best practice a coloured glass flask is used for UV light protection which is equipped with a magnetic stirrer. 750 grams of acetone as inert solvent is poured in the glass flask. 5 grams of the photo initiator 2,2-dimethoxy-1,2-diphenylethan-1-one is dissolved in the acetone for 20 minutes at 250 rpm on the magnetic stirrer with no heating. 50 grams of reactive diluent (dimethacrylate) is added to the mixture and mixed further for 20 minutes. 195 grams of PFPE-based reactive copolymer is added subsequently and stirred for further 2 hours until complete dissolution. The clear solution is filtered using membrane filters or capsule filters made of Nylon-based or PTFE-based materials. This removes particle impurities with a size down to the sub 100 nm range depending on the pore size of the filter.

The ratio of the inert solvent to the remaining constituents of the inventive resist composition is in the present case of executive example 7.5 parts inert solvent (weight):2.5 parts remaining constituents (weight). The ratio may be amended in view of the application of the inventive resist composition.

As PFPE-based copolymer, reactive diluent, photo initiator and inert solvent all suitable as well as preferred materials disclosed with respect to the first aspect of the present invention can be used. Preferably the PFPE-based copolymer comprises a spacer group and one or two curable units, preferably selected from acrylate, methacrylate and/or epoxide.

Alternatively, the reactive components can also be thermally cured. In this case, the photo initiator is substituted by a suitable thermal initiator, preferably benzoyl peroxide.

The individual features of the aforementioned executive example can independently from each other be inventively combined with the inventive embodiments of the general description.

C: Imprinting of the Inventive Resist Composition by a Nanoimprint Lithography Process A ready-to-use solution of inventive resist is used, which preparation is described in Part B as executive example 15 and which delivers ca. 500 nm thick layer at 3000 rpm on spin-coater.

A round, single-side polished, 300 μm-thick 2'-Si wafer from Siegert Wafer GmbH was preconditioned in the plasma oven from the company Tepla 300 semi-auto Plasmaprozessor for 1 minute under $O_2$-plasma. Approximately 1 ml of the adhesion promoter mr-APS1 is deposited in the middle of the Si wafer and spun on the wafer at 5000 rpm for 1 minute on a Delta 6RC Spin Coater from the company Soss.

The adhesion promoter is prebaked at 150° C. for 1 minute, which delivers a continuous, defect-free, sub 10 nm layer of the adhesion promoter. 1 ml of the inventive resist composition is deposited in the middle of the adhesion promoter coated wafer. The resist is spun at 3000 rpm for 30 seconds.

The thickness of the layer is determined by white light interferometer FTP500 (Sentech, Berlin, Germany) to be approximately 500 nm.

The wafer is placed on the object carrier of the Nanoimprinter Obducat2, where the resist coated side is facing upwards. A transparent stamp, which is produced from OrmoStamp® material, has been placed on the resist where the nanostructured side of the stamp is facing the resist. The material stack was pressed with a 7 bar imprinted pressure for 20 seconds for filling and exposed for 20 seconds by a broad band UV lamp having 15 mW/cm² for UV curing. Upon imprinting the stamp substrate assembly is removed from the machine and demolded by the help of a razor blade, where the blade is used to separate the stack exactly between the resist and the stamp. The negative copy of the stamp topography is successfully transferred to the imprinted resist article of the present invention.

Inventive Nanopatterned Substrate Article is Produced as Follows:

The inventive imprinted resist article comprising the cured inventive resist article can be further processed by plasma chemistry or wet chemical etching in order to transfer preferably the positive copy of the topography of the resist to the underlying substrate, or using it as an etch mask for generating structures process-dependent further architectures derived from the topography of the imprinted resist article. For instance a dry etching process using the following parameters with STS-ICP (Surface Technology Systems-Inductively Coupled Plasma) delivers a 145 nm/min etch rate whereas 164 nm/min etch rate for SI is observed, corresponding to an etch selectivity of not less than 1:1.

| | |
|---|---|
| Pressure | 9 mTorr |
| Coil power | 450 W |
| Plate power | 12 W |
| $C_4F_8$ Fow rate | 90 sccm |
| $SF_6$ Flow rate | 30 sccm |

D: Properties of Inventive Resist Composition

FIG. 1 shows a comparison of the water contact angles of cured inventive resist prototype surfaces in an analogue series with an increasing amount of PFPE content.

■ represents water contact angles on the executive examples 5, 6, 7, 8 after curing in contact with an ASL-coated blank dummy glass mold without any nanostructures with respect to the PFPE content in the inventive resist ▲ represents water contact angles on the executive examples 5, 6, 7, 8 after curing in contact with a dummy glass mold without ASL with respect to the PFPE content in the inventive resist ☐ represents water contact angle on the executive example 2 after curing in contact with an ASL-coated dummy glass mold with respect to its PFPE content Δ represents water contact angle on the executive example 2 after curing in contact with a dummy glass mold without ASL with respect to its PFPE content Executive examples 2, 5, 6, 7 and 8 are characterized with a Surftens dynamic water contact angle measurement equipment (OEG GmbH, Frankfurt-Oder, Germany). The contact angles are measured on the solid inventive resist surfaces which were cured in contact with a dummy glass mold without any nanostructures. The executive examples 5, 6, 7, 8 with varying PFPE amount have shown a linear trend depending on the amount of the PFPE in the inventive resist composition.

All materials were imprinted once with dummy glass mold without anti-sticking layer (ASL) and once with freshly ASL coated dummy glass mold. Depending on the surface energy of the glass mold, the material surface rearranges itself to exhibit different surface energies, exhibiting higher surface energy (lower water contact angle) when cured in contact with a higher surface energy mold and exhibiting lower surface energy (higher water contact angle) when cured in contact with a lower surface energy mold. The executive example 2 contains 10% of the further component and therefore has shown a deviation from the trend when compared with the executive example 6 which also contains 80% PFPE, too. However, the similar behavior in the contact angle difference caused by the contact with low and high energy stamp surfaces was preserved, even if the inventive resist is composed of more components than two components like in example 2.

Figure 2:
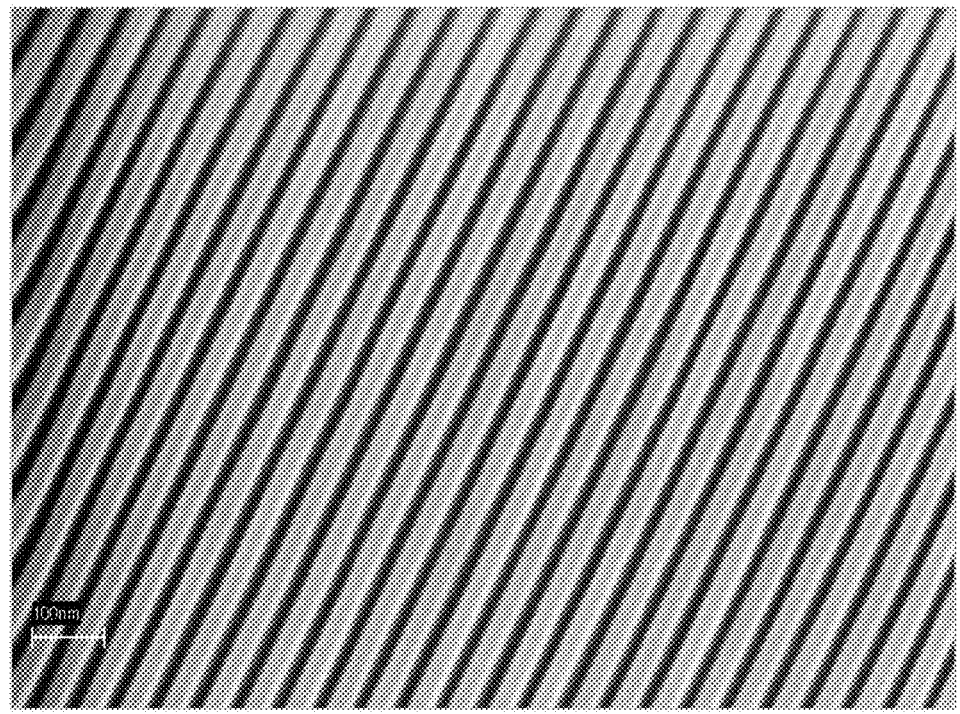
FIG. 2 shows a scanning electron microscope (SEM) image of 15 nm trenches and 50 nm bars imprinted into a layer of (spin-coating prototype) an inventive resist composition on a glass substrate coated with primer (mr-APS1).

FIG. 2 shows a scanning electron microscope (SEM) image of 15 nm trenches and 50 nm bars imprinted into a layer of (spin-coating prototype) an inventive resist composition according to executive example 2 on a glass substrate coated with primer (mr-APS1). The Si mold was provided by Eulitha AG, Villigen, Switzerland. ASL: F13-TCS. Pattern depth: 50 nm (Courtesy of Paul Scherrer Institut (PSI), Villigen, Switzerland. Scale: 100 nm).

Figure 3:
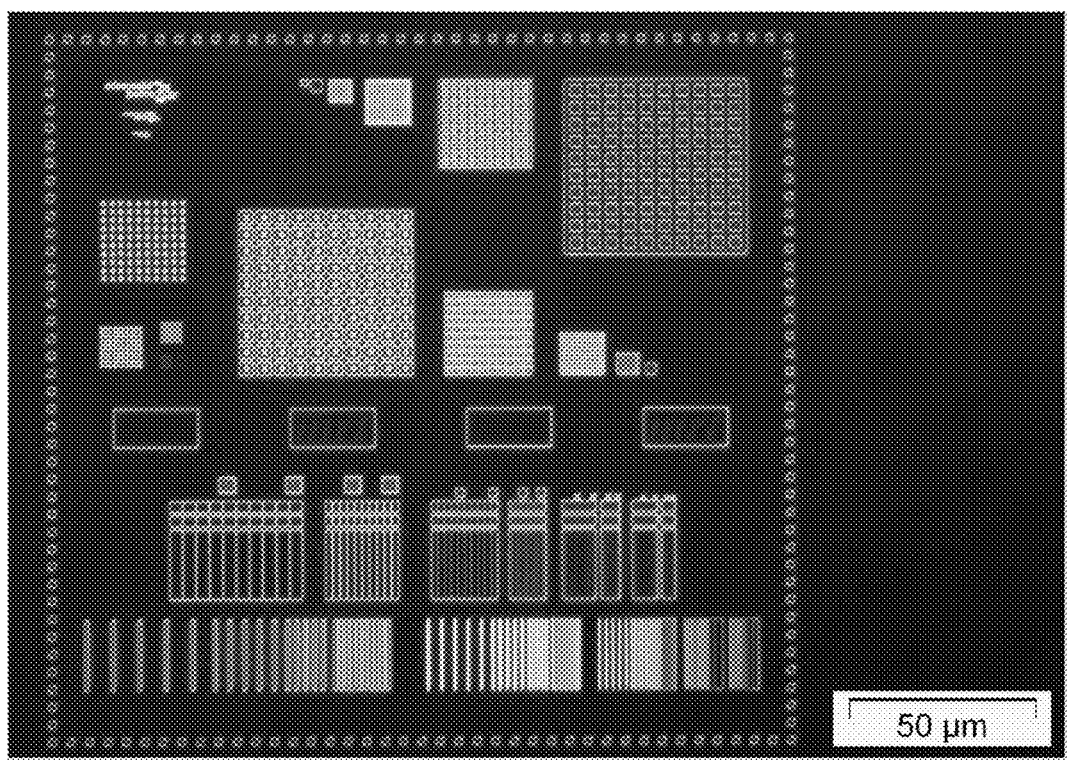
FIG. 3 shows a dark field optical micrograph of an inventive resist composition on glass substrate imprinted with a Si mold comprising no anti-sticking layer (ASL).

FIG. 3 shows a dark field optical micrograph of an inventive resist composition according to executive example 11 on glass substrate imprinted with a Si mold, with no ASL. 75 nm resolution was reproduced with available stamps. The drawing shows a large imprint area without any sign of tear-offs.

Figure 4A:
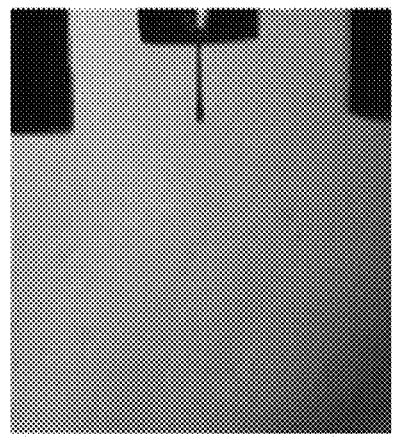
FIGS. 4a), b), c) and d) show a stable droplet generation without the generation of satellites by ink-jet dispensing of an inventive resist composition using a MicroFab nozzle.
Figure 4B:
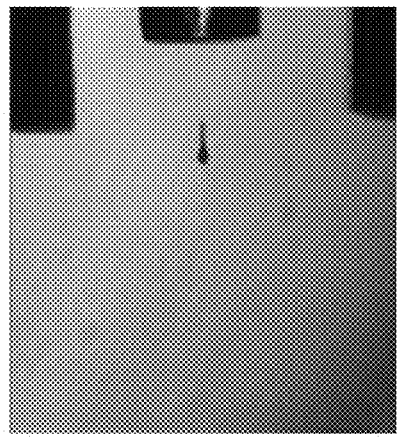
Figure 4C:
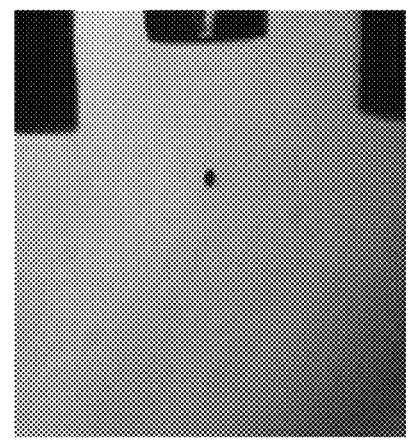
Figure 4D:
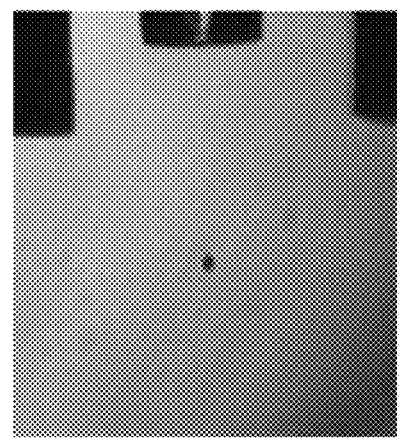

FIGS. 4a), b), c) and d) show a stable droplet generation without the generation of satellites by ink-jet dispensing of an inventive resist composition according to executive example 10 using an ink-jet nozzle with an orifice diameter of 50 μm from the MicroFab Technologies Inc., Texas, USA.

The ink-jet dispensing parameters are as follows: viscosity of inventive resist composition: 36 mPas, process temperature: room temperature, voltage: 40-45 V, frequency: 500 Hz, pulse length: 18-40 μs.

The invention claimed is:

1. A process of production of a nanopatterned and/or nanoprocessed substrate article by use of nanoimprint lithography processes comprising of the following steps:
    a. providing a substrate suitable for nanoimprint lithography processes,
    b. applying a suitable amount of a resist composition comprising a perfluoropolyether (PFPE)-based reactive copolymer, a suitable reactive diluent, and a suitable polymerization initiator on at least part of a surface of the substrate provided in step a) to form a layer having a thickness below 1 μm, wherein the weight ratio of the PFPE-based reactive copolymer in the resist composition is within 20 to 95 wt. %,
    c. providing a stamp suitable for nanoimprint lithography processes and imprinting the resist composition applied to the substrate in step b) with the stamp to generate a negative copy of the stamp topography on the resist,
    d. releasing the stamp to set free an imprinted resist article on the substrate and
    e. subsequently using at least a part of the imprinted resist article as an etch mask to produce a nanopatterned substrate article comprising at least part of a positive copy of the topography of the imprinted resist article and/or
    f. subsequently etching a part of the imprinted resist article and using the partly etched imprinted resist article as a deposition mask to deposit a further material to the substrate to produce a heterogeneous nanoprocessed substrate article.

2. The process according to claim 1, wherein the weight ratio of the PFPE-based reactive copolymer is within 35 to 95 wt. %.

3. The process according to claim 1, wherein the weight ratio of the PFPE-based reactive copolymer is within 35 to 50 wt. %.

4. A nanopatterned and/or nanoprocessed substrate article produced by a nanoimprint lithography process according to claim 1.

5. A device comprising a nanopatterned and/or nanoprocessed substrate article according to claim 4, wherein the device is selected from the group consisting of integrated circuits (IC), integrated optics, nanophotonic devices, photovoltaic devices, bit-patterned media, displays, diodes, (bio)sensors, and lab-on-chip devices.

6. The device according to claim 5, wherein the photovoltaic device is a solar cell.

7. The device according to claim 5, wherein the display is a TFT-display.

8. The device according to claim 5, wherein the diode is a light emitting diode (LED) or organic light emitting diode (OLED).

* * * * *